US010332805B2

(12) United States Patent
Dungan et al.

(10) Patent No.: US 10,332,805 B2
(45) Date of Patent: Jun. 25, 2019

(54) SEMICONDUCTOR STRUCTURE WITH STRAIN REDUCTION

(71) Applicant: Avago Technologies General IP (Singapore) Pte. Ltd., Singapore (SG)

(72) Inventors: Thomas Edward Dungan, Fort Collins, CO (US); Jonathan Kwadwo Abrokwah, Fort Collins, CO (US); Forest Dixon, Timnath, CO (US); William Snodgrass, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/797,302

(22) Filed: Oct. 30, 2017

(65) Prior Publication Data

US 2019/0131175 A1   May 2, 2019

(51) Int. Cl.
*H01L 27/06* (2006.01)
*H01L 29/08* (2006.01)
*H01L 29/10* (2006.01)
*H01L 29/66* (2006.01)
*H01L 29/78* (2006.01)
*H01L 29/732* (2006.01)
(Continued)

(52) U.S. Cl.
CPC .. *H01L 21/8249* (2013.01); *H01L 21/823481* (2013.01); *H01L 27/0623* (2013.01); *H01L 29/0813* (2013.01); *H01L 29/1004* (2013.01); *H01L 29/66287* (2013.01); *H01L 29/66666* (2013.01); *H01L 29/7322* (2013.01); *H01L 29/7827* (2013.01)

(58) Field of Classification Search
CPC ............ H01L 21/8249; H01L 29/1004; H01L 29/66666; H01L 21/823481; H01L 29/7322; H01L 29/0813; H01L 29/66287; H01L 27/0623; H01L 29/7827; H01L 29/737; H01L 29/7378; H01L 23/367; H01L 23/535; H01L 29/73; H01L 23/373; H01L 29/7842
USPC ................ 257/586, 737, E23.068, 629, 197; 438/637, 315
See application file for complete search history.

(56) References Cited

U.S. PATENT DOCUMENTS 5,719,433 A * 2/1998 Delage .................. H01L 23/367
257/522
5,767,578 A * 6/1998 Chang ...................... H01L 23/29
257/501

(Continued)

*Primary Examiner* — Nduka E Ojeh

(57) ABSTRACT

A transistor module includes a substrate; a transistor on the substrate; a dielectric layer disposed over the transistor and the substrate; a metal layer disposed over the dielectric layer and the transistor, the metal layer contacting a portion of the transistor; a metal pillar disposed over the metal layer; and a dielectric cushion disposed between the metal layer and the metal pillar over the transistor. The dielectric cushion includes dielectric material that is softer than the metal pillar, for reducing strain on semiconductor junctions when at least one of tensile or compressive stress is exerted on the metal pillar with respect to the substrate. The transistor module may further include at least one buttress formed between the metal layer and the substrate, adjacent to the transistor, for further reducing strain on the semiconductor junctions by providing at least one corresponding alternative stress path that substantially bypasses the transistor.

19 Claims, 3 Drawing Sheets

(51) Int. Cl.
    *H01L 21/8234*     (2006.01)
    *H01L 21/8249*     (2006.01)
    *H01L 21/02*     (2006.01)

(56) References Cited

U.S. PATENT DOCUMENTS

| | | |
|---|---|---|
| 8,513,109 B2 | 8/2013 | Child |
| 9,306,535 B2 | 4/2016 | Bradley et al. |
| 9,653,586 B2 | 5/2017 | Dugan et al. |
| 9,735,123 B2 | 8/2017 | Lee et al. |
| 2011/0233763 A1 | 9/2011 | Pendse et al. |
| 2013/0134560 A1* | 5/2013 | Wholey ............... H01L 23/564 257/629 |
| 2016/0020179 A1* | 1/2016 | Abrokwah ............ H01L 23/564 257/737 |
| 2017/0062595 A1* | 3/2017 | Dungan .............. H01L 29/7371 |

\* cited by examiner

SEMICONDUCTOR STRUCTURE WITH STRAIN REDUCTION

BACKGROUND

Modern wireless communications devices include a number of flip-chip assembled radio frequency (RF) power amplifiers, for example, typically implemented in packaged semiconductor devices or modules. The packaged semiconductor devices include multiple transistors, arranged on a semiconductor substrate, including a signal path of the RF power amplifiers. The transistors may be bipolar junction transistors (BJTs) or heterojunction bipolar transistors (HBTs), each of which includes a base, an emitter and a collector.

To handle the enormous dissipated power density in the transistors, the emitters of the transistors may be directly connected to a module printed circuit board (PCB) through metal (e.g., copper) pillars. The module PCBs may then be connected to a mother board, for example. For best thermal and electrical connection, the pillars are placed directly over the transistors, and more particularly, over the emitter and base portions of the transistors (which are typically stacked). In this configuration, the emitters are directly connected to the PCB through a vertical stack of metal comprising an on-die interconnect, the copper pillar and solder. This configuration provides substantially uniform thermal conductivity and compact, low-inductance electrical connections. However, the direct vertical metal stack also transmits significant strain to semiconductor junctions of the transistors (e.g., base-emitter junctions) due to plastic deformation of the metal stack, mold compound covering the transistors and the PCB during assembly of the RF front-end-module to the mother board. The semiconductor junctions are the junctions where materials forming the various components of a transistor meet. For example, in an NPN bipolar transistor, the base-emitter junction is the transition plane from the N-type-doped emitter to the P-type-doped base. In a HBT, the different layers meeting at the junction might be formed of different semiconductor materials, as well as different doping polarities. For example, a common RF power amplifier HBT may include an emitter with a wider bandgap (e.g., Indium gallium phosphide (InGaP)) in contact with a relatively narrower bandgap material (e.g., gallium arsenide (GaAs)) in the base. For example, base-emitter junctions may be in the regions that are below emitter strips, where the emitter strips meet a base mesa. The strain on the semiconductor junctions from such chip-package interaction alters the semiconductor bandgap, which alters the semiconductor junction turn-on voltage, which alters the RF performance at a fixed bias voltage, and subsequent relaxation of such strain can lead to changes in electrical performance across the product lifetime.

For example, strain may occur through chip-package interaction in assembly of the semiconductor module. During solder reflow, for example, to attach the RF front-end-module to the mother board, the module assembly has already been completed. Therefore, organic mold compound (e.g., with inorganic filler particles) has already been injected into spaces between a flipped power amplifier die and the module substrate. During attachment of the module to the mother board, the reflow cycle heats all the materials, causing them to expand, and the pillar solder joints melt, allowing the solder to elongate. In the reflow cool-down, the solder refreezes in an elongated state, while the mold compound (and other dielectrics) continue to contract, putting the pillars (and the semiconductor junctions directly connected to them) into compressive strain.

Accordingly, there is a need for providing metal pillars in the module PCBs that provide structural support and electrical conductivity, as well as heat dissipation, without causing undue strain on the semiconductor junctions.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

Figure 1:
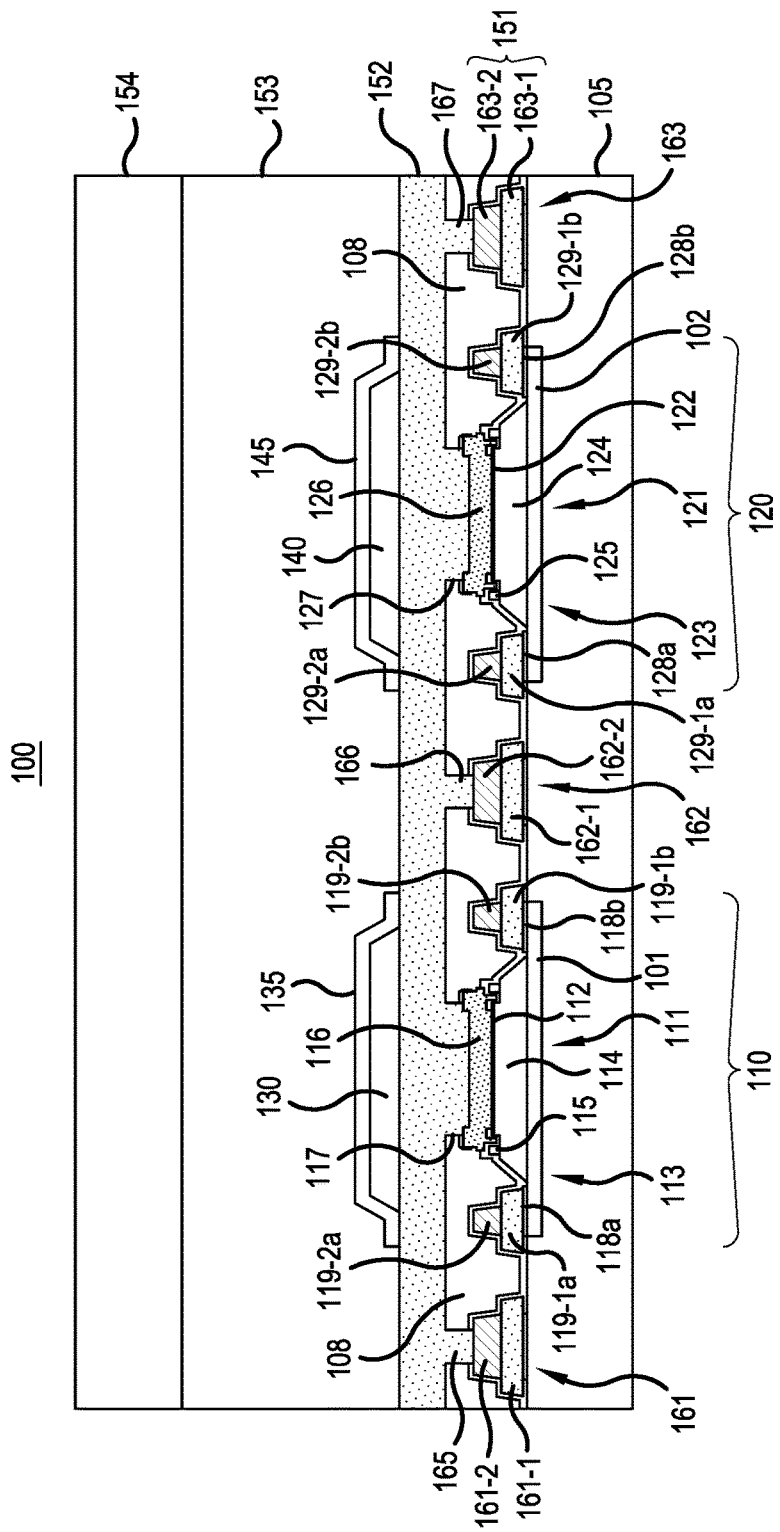
FIG. 1 is a cross-sectional view of a semiconductor structure with a dielectric cushion and buttresses, in accordance with a representative embodiment.

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments. Further, it is understood that the various configurations of electrical components and connections depicted in the figures are illustrative, and therefore may vary without departing from the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, various embodiments include a semiconductor structure, e.g., of a power amplifier, having an on-die interconnect system that includes dielectric cushions arranged over transistor(s) in the semiconductor structure. That is, the on-die interconnect system may include multiple layers of relatively soft, insulating low-K dielectric material (s), such as benzocyclobutene (BCB), and conductive plated metal layers, such as gold (Au) and copper (Cu), for example, where the metal layers may deposited by thermal evaporation, sputtering, or electroplating, for example. The interconnect layout is arranged to replace a vertical metal stack, including a metal pillar extending to the PCB, above the emitter of each transistor, as discussed above, with an offset metal structure, thereby reducing and/or minimizing the transfer of stress from the pillars to the semiconductor junctions. Softer, organic dielectric material (e.g., BCB) is included in dielectric cushions between the emitters of each transistor and the PCB to cushion the stress. The layout of the dielectric materials and the connections between the metal layers may be refined to optimize the trade-off between thermal resistance (and thermal resistance uniformity) and stress transmission.

Further, various embodiments include one or more buttresses formed of metal (e.g., gold) arranged between the metal pillar and a substrate of the die in order to shunt additional stress away from the semiconductor junctions, further reducing the overall strain on the semiconductor junctions. The trade-off between thermal and electrical resistance, each of which increases due to off-setting the pillars from being in direct contact with the transistors, and mechanical compliance of the interconnect, which increases the connections to the pillars positioned away from the transistors, can be controlled to provide an optimum balance. The one or more buttresses may be implemented independently, or in conjunction with dielectric cushions, discussed above.

FIG. 1 shows a cross-sectional view of a portion of a semiconductor structure 100, including dielectric cushions and buttresses, according to a representative embodiment. In particular, the cross-section shown in FIG. 1 is taken along line A-A' of FIG. 3 (top view), discussed below.

Referring to FIG. 1, semiconductor structure (die) 100 includes two transistors, first transistor 110 and second transistor 120, which are formed on first and second semiconductor sub-collector layers 101 and 102, respectively, located on or at least partially in a substrate 105. The first and second transistors 110 and 120 may be radio frequency (RF) output stage transistors, such as heterojunction bipolar transistors (HBTs), of a power amplifier, for example. The substrate 105 may be formed of one or more semiconductor materials. Semiconductor materials for the substrate 105 may include compound semiconductor materials, such as Group III-V compounds (e.g., GaAs or Indium phosphide (InP)), or Group IV materials, such as silicon (Si) or silicon-germanium (SiGe), for example. Each of the first and second semiconductor sub-collector layers 101 and 102 may be formed by epitaxial growth, and patterned (isolated) by etching or implantation, for example.

The semiconductor structure 100 further includes two illustrative dielectric cushions, a first dielectric cushion 130 formed over the first transistor 110 and a second dielectric cushion 140 for over the second transistor 120. In the depicted embodiment, the first and second dielectric cushions 130 and 140 are formed on a second metal layer 152, and thus between the second metal layer 152 and a third metal layer 153, which may be a metal redistribution layer (RDL) or a general purpose interconnect layer or pedestal, on which a metal pillar 154 is formed. In an alternative embodiment, the semiconductor structure 100 does not include the third metal layer 153, in which case the first and second dielectric cushions 130 and 140 are formed directly between the second metal layer 152 and the metal pillar 154.

The metal pillar 154 may include a single layer of selected conductive material (e.g., copper), or may include more than one layer of the selected conductive material (e.g., multiple layers of copper). Alternatively, the metal pillar 154 may include layers of different materials. For example, in certain embodiments the pillar 154 includes a comparatively thick layer of copper and a layer of solder, such as tin-silver (SnAg) or tin-copper (SnCu) solder, disposed over the layer of copper. Heat from the underlying first and second transistors 110 and 120 can be dissipated through the metal pillar 154. Also, the metal pillar 154 may be used to provide electrical conductivity.

The first dielectric cushion 130 is formed by a first dielectric material, which may be covered by a first passivation covering 135 surrounding at least a portion of the first dielectric material. Likewise, the second dielectric cushion 140 is formed by a second dielectric material, which may be covered by a second passivation covering 145 surrounding at least a portion of the second dielectric material. The first and second dielectric material(s) are softer than the metal pillar 154, and may include an organic spin-on thin film, such as benzocyclobutene (BCB), polybenzoxazole (PBO) material and/or a polyimide material, for example, although inorganic dielectric materials may be used in the alternative. The first and second passivation coverings 135 and 145 may include an inorganic material, such as silicon nitride ($Si_3N_4$), silicon dioxide ($SiO_2$), aluminum nitride (AlN) or an oxynitride (e.g., aluminum oxynitride, silicon oxynitride), for example, although organic dielectric materials may be used in the alternative. The first and second dielectric cushions 130 and 140 may be formed of the same or different materials, and the first and second passivation coverings 135 and 145 may be formed of the same of different materials, without departing from the scope of the present teachings. In various embodiments, the first and second passivation coverings 135 and 145 may be formed from the same passivation layer applied over the second metal layer 152, in which case they would be formed of the same material. Of course, other dielectric materials may be incorporated without departing from the scope of the present teachings.

Generally, the first and second dielectric cushions 130 and 140 reduce strain on semiconductor junctions (e.g., emitter-base junction) of the first and second transistors 110 and 120 when at least one of tensile stress or compressive stress is exerted on the metal pillar 154 with respect to the substrate 105, where the metal pillar 154 is positioned over the first and second transistors 110 and 120. The first and second dielectric cushions 130 and 140 effectively eliminate the direct vertical stack of metal from the first and second transistors 110 and 120 (e.g., the respective first and second emitters 112, 122) through the metal pillar 154, allowing the softer organic dielectric material(s) to cushion at least a portion of the stress, while the metal flexes. In alternative embodiments, the first and second dielectric cushions 130 and 140 may be formed without the surrounding first and second passivation coverings 135 and 145.

In the depicted embodiment, the third metal layer 153 directly contacts the second metal layer 152 in areas between adjacent dielectric cushions, e.g., first and second dielectric cushions 130 and 140. The area between the first dielectric cushion 130 and the second dielectric cushion 140 may be referred to as a pad connection between the third metal layer 153 and the second metal layer 152, and the area between an outer edge of the first passivation covering 135 and an opposing outer edge of the second passivation covering 145 may be referred to as a passcut connection between the third metal layer 153 and the second metal layer 152. The pad and/or passcut connections enable electrical and thermal conductivity between the first and second transistors 110 and 120 and the metal pillar 154.

Accordingly, the first and second dielectric cushions 130 and 140 reduce changes to semiconductor bandgaps, e.g., occurring during assembly and/or subsequent thermal cycles, of the respective first and second transistors 110 and 120. The reduced changes to the semiconductor bandgaps substantially stabilize quiescent current levels of each of the corresponding first and second transistors 110 and 120 during post-assembly thermal cycles due to ambient temperature changes or due to self-heating in operation, for example.

The semiconductor structure 100 also includes a number of buttresses between the second metal layer 152 and the substrate 105 to provide physical support and to further reduce strain on the semiconductor junctions due to at least one of tensile and compressive stress. In the depicted embodiment, the semiconductor structure 100 includes representative strip buttresses 161, 162 and 163 formed between the second metal layer 152 and the substrate 105 adjacent to the first transistor 110 and the second transistor 120, respectively, extending parallel to emitter (strips) 112, 122 of the first and second transistors 110, 120. More particularly, the strip buttress 161 is between the first transistor 110 and an adjacent transistor (or other adjacent component or the outer edge of the semiconductor structure 100), the strip buttress 162 is between the first and second transistors 110 and 120, and the strip buttress 163 is between the second transistor 120 and another adjacent transistor (or other adjacent component or the outer edge of the semiconductor structure 100). Each of the strip buttresses 161, 162 and 163 is formed of a stack comprising a bottom metal portion and a top metal portion (which may be part of first metal layer 151 of the semiconductor structure 100), and is in contact with the second metal layer 152 by a corresponding pad, such that the strip buttresses 161, 162 and 163 effectively create vertical stacks of metal from the metal pillar 154 to the substrate 105. That is, the strip buttress 161 includes a first bottom metal portion 161-1 and a first top metal portion 161-2, the strip buttress 162 includes a first bottom metal portion 162-1 and a first top metal portion 162-2, and the strip buttress 163 includes a first bottom metal portion 163-1 and a first top metal portion 163-2. In alternative embodiments, each of the strip buttresses 161, 162 and 163 may be formed of a single metal portion, e.g., corresponding to the first metal layer 151, as opposed to stacked bottom and top metal portions), without departing from the scope of the present teachings. The strip buttresses 161, 162 and 163 contact the second metal layer 152 via contact pads 165, 166 and 167, respectively. Notably, the strip buttresses 161, 162 and 163 (as well as additional buttresses discussed below) may be composed of different stacks of metal, and may include rigid (inorganic) dielectrics, without departing from the scope of the present teachings. The point of the buttresses is to provide a relatively rigid structure from the pillar 154 overhead to the substrate 105 below. In order to avoid electrically tying the emitters 112, 122 (connected to the pillar 154) to the active semiconductor layers, the strip buttresses 161, 162 and 163 either need to land on isolated regions in the substrate 105 (for example, regions where the subcollector has been rendered non-conductive by implant isolation) or by landing on a rigid insulating layer (for example, an inorganic silicon nitride layer over the field regions of the substrate 105).

Each of the strip buttresses 161, 162 and 163 further reduces strain on the semiconductor junctions when the tensile stress and/or compressive stress is exerted on the metal pillar 154 with respect to the substrate 105. That is, the strip buttresses 161, 162 and 163 provide corresponding alternative paths that redirect the stress, thus substantially bypassing the first and second transistors 110 and 120, with or without the inclusion of the first and second dielectric cushions 130 and 140. The bottom metal portions (161-1 to 163-1) and the top metal portions (161-2 to 163-2) of the strip buttresses 161, 162 and 163 may be formed of metal, such as gold (Au), for example, although other materials capable of enhancing structural support and redirecting stress away from the first and second transistors 110 and 120 may be incorporated without departing from the scope of the present teachings. Additional buttresses positioned outside the plane of the cross-section shown in FIG. 1, such as base-side buttresses (e.g., representative base-side buttress 263) and collector-side buttresses (e.g., representative collector-side buttress 265) may also be included, as discussed below with reference to FIGS. 2 and 3.

For purposes of explanation, the first and second transistors 110 and 120 are described as BJTs or HBTs, although it is understood that they may be implemented as other types of transistors, such as field effect transistors (FETs) without departing from the scope of the present teachings. The first transistor 110 includes a first base 111, a first emitter 112, and a first collector 113. The first base 111 includes an upper portion of a first base mesa 114 formed on the first semiconductor sub-collector layer 101 and first base metallization 115 formed on the first base mesa 114. The first base mesa 114 is formed of electrically semiconducting material, such as GaAs or InP, and the first base metallization 115 is formed of electrically conductive material, such as gold (Au), platinum (Pt) or copper (Cu), for example.

The first emitter 112 is an emitter strip that runs normal (perpendicular) to the cross-sectional view of FIG. 1. In various embodiments, the first emitter 112 may include two (or more) first emitter strips running parallel to one another, normal to the cross-sectional view of FIG. 1, thus the term first emitter 112 is intended to cover multiple first emitter strips, as well. The first emitter 112 is formed on the first base mesa 114, between portions of the first base metallization 115, where the first emitter 112 is electrically separated from the portions of the first base metallization 115 by electrically insulating material. When the first emitter 112 includes two emitter strips, for example, a portion of the first base metallization 115 may run between the two emitter strips, as well. The first emitter 112 is electrically connected to the second metal layer 152 via a metal contact 116 and a metal pad 117 (e.g., extending from the second metal layer 152). In alternative embodiments, the first emitter 112 may be electrically connected directly to the metal pad 117, without departing from the scope of the present teachings.

In the depicted embodiment, the first collector 113 includes a lower portion of a first base mesa 114 and a pair of first collector strips 113*a* and 113*b*, also running normal to the cross-sectional view of FIG. 1 (and parallel to the first emitter 112). The first collector strips 113*a* and 113*b* are formed on the first semiconductor sub-collector layer 101.

The first collector strips 113a and 113b include first collector metal 118a and 118b, first bottom metal portions 119-1a and 119-1b, and first top metal portions 119-2a and 119-2b, respectively, stacked in that order on the first semiconductor sub-collector layer 101. The first bottom and top metal portions 119-1a, 119-1b, 119-2a and 119-2b may be part of a first metal layer 151 of the semiconductor structure 100. The first and third metal layers 151 and 153, as well as the metal pillar 154, may be formed of copper (Cu) or gold (Au), and the second metal layer 152 may be formed of gold (Au), for example, although other electrically and/or thermally conductive materials may be incorporated without departing from the scope of the present teachings.

The second transistor 120 is arranged adjacent to the first transistor 110 on the substrate 105 and the second semiconductor sub-collector layer 102. Similar to the first transistor 110, the second transistor 120 includes a second base 121, a second emitter 122, and a second collector 123. The second base 121 includes an upper portion of a second base mesa 124 formed on the second semiconductor sub-collector layer 102 and second base metallization 125 formed on the second base mesa 124. The second base mesa 124 is formed of electrically semiconducting material, such as GaAs or InP, and the second base metallization 125 is formed of electrically conductive material, such as gold (Au), aluminum (Al) or copper (Cu), for example.

The second emitter 122 is an emitter strip that runs normal to the cross-sectional view of FIG. 1. The second emitter 122 is formed on the second base mesa 124, between portions of the second base metallization 125, where the second emitter 122 is electrically separated from the portions of the second base metallization 125 by electrically insulating material. In various embodiments, the second emitter 122 may include two (or more) second emitter strips running parallel to one another, normal to the cross-sectional view of FIG. 1, thus the term second emitter 122 is intended to cover multiple first emitter strips, as well. The second emitter 122 is electrically connected to the second metal layer 152 via a metal contact 126 and a metal pad 127. In alternative embodiments, the second emitter 122 may be electrically connected directly to the metal pad 127, without departing from the scope of the present teachings.

The second collector 123 includes a lower portion of the second base mesa 124, and a pair of second collector strips 123a and 123b also running normal to the cross-sectional view of FIG. 1 (and parallel to the second emitter 122, as well as the first emitter 112). The second collector strips 123a and 123b are formed on the second semiconductor sub-collector layer 102. The second collector strips 123a and 123b include second collector metal 128a and 128b, second bottom metal portions 129-1a and 129-1b, and second top metal portions 129-2a and 129-2b, respectively, stacked in that order on the second semiconductor sub-collector layer 102. The second bottom and top metal portions 129-1a, 129-1b, 129-2a and 129-2b may be part of the first metal layer 151 of the semiconductor structure 100.

A first dielectric layer 108 is provided to fill spaces among the components of the semiconductor structure 100, including the first and second transistors 110 and 120 and the strip buttresses 161, 162 and 163. The first dielectric layer 108 is formed of a first dielectric material that is primarily electrically insulating. Thus, for example, the first collector 113 is substantially electrically insulated from the second collector 123, the second base 121 and the second emitter 122. Examples of the first dielectric material include organic spin-on thin films, such as a BCB material, a PBO material and a polyimide material, for example, although other dielectric materials, both organic and inorganic, may be incorporated without departing from the scope of the present teachings.

As mentioned above, the second metal layer 152 is formed over the first and second transistors 110 and 120, and over the first dielectric layer 108. The second metal layer 152 is electrically connected to the first emitter 112 and the second emitter 122 via the metal contacts 116 and 126 and the metal pads 117 and 127. The first and second dielectric cushions 130 and 140 are formed on the second metal layer 152, with the first and second passivation coverings 135 and 145 applied to the top and side surfaces of the first and second dielectric cushions 130 and 140, respectively. The first and second dielectric cushions 130 and 140 collectively may be referred to as a second dielectric layer. The third metal layer 153 is optionally formed over the second metal layer 152 and the first and second dielectric cushions 130 and 140. The metal pillar 154 is formed on the third metal layer 153. If there is no third metal layer 153, then the metal pillar 154 is formed over the second metal layer 152 and the first and second dielectric cushions 130 and 140 directly.

Figure 2:
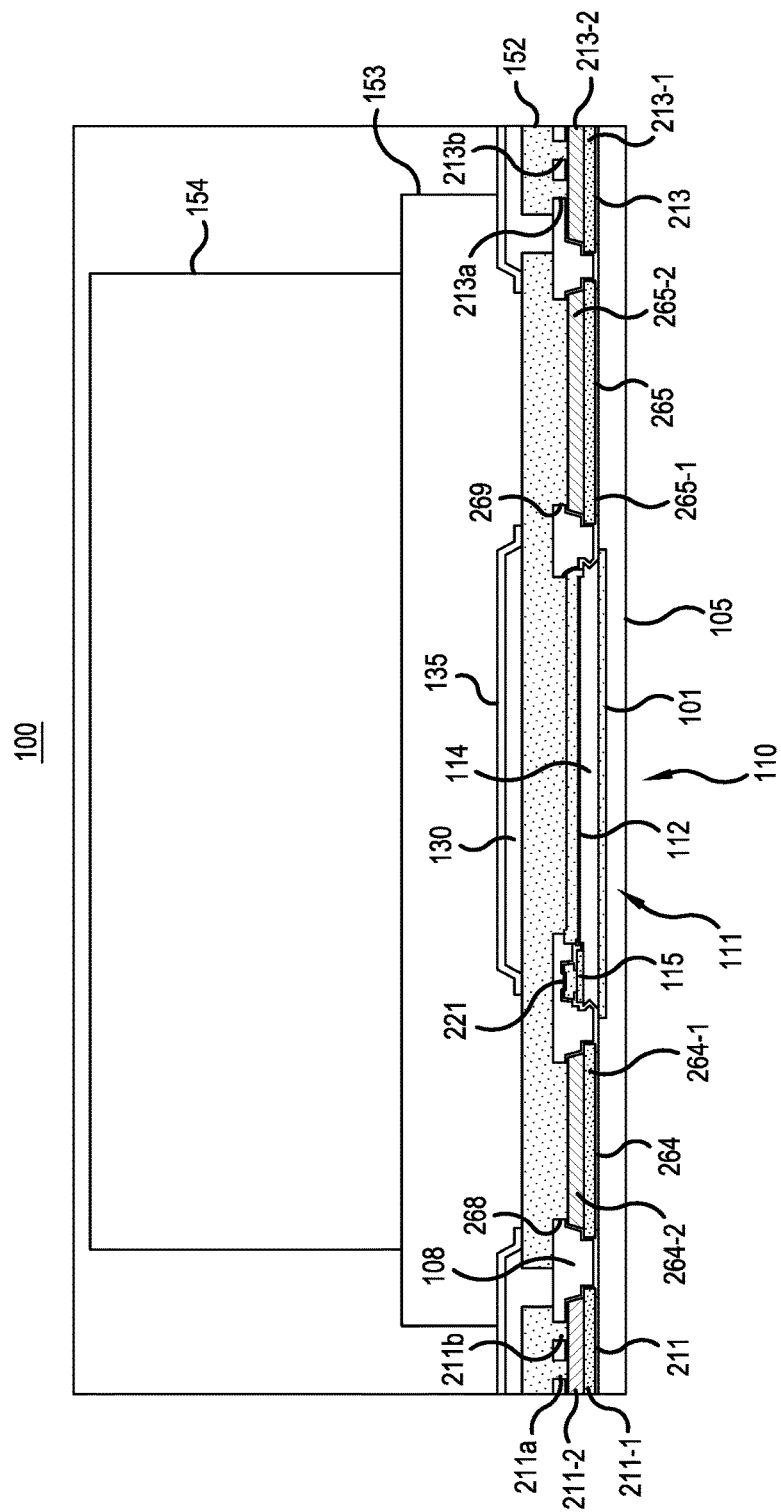
FIG. 2 is another cross-sectional view of a semiconductor structure with a dielectric cushion and buttresses, in accordance with a representative embodiment.

FIG. 2 shows another cross-sectional view of a portion of a semiconductor structure 100, including dielectric cushions and buttress, according to a representative embodiment. In particular, the cross-section shown in FIG. 2 is taken along line B-B' of FIG. 3, discussed below. That is, the cross-section is perpendicular to that of FIG. 1, passing through the first transistor 110 of the semiconductor structure 100.

Referring to FIG. 2, the first transistor 110 is formed on the first semiconductor sub-collector layer 101 on the substrate 105. The first dielectric cushion 130 is formed over the first transistor 110 on the second metal layer 152. Thus, the first dielectric cushion 130 is positioned between the second metal layer 152 and the third metal layer 153, on which the metal pillar 154 is formed. In an embodiment, the semiconductor structure 100 does not include the third metal layer 153, in which case the first dielectric cushion 130 is formed between the second metal layer 152 and the metal pillar 154.

As discussed above, the first transistor 110 includes the first base 111, the first emitter 112, and the first collector 113 (not shown in FIG. 2). The first base 111 includes the upper portion of the first base mesa 114 formed on the first semiconductor sub-collector layer 101 and the first base metallization 115 (not shown in FIG. 2) formed on the first base mesa 114. Only the first emitter 112 is shown in FIG. 2, which comprises an emitter strip extending along an upper surface of the first base 111 and electrically, mechanically and thermally connected to the second metal layer 152.

The semiconductor structure 100 further includes a base feed 211, formed on the substrate 105 at a base-side of the semiconductor structure 100. The base feed 211 is connected to a base terminal 221 of the first base 111 in the first transistor 110, although the connection to the base terminal 221 is not shown in this particular cross-section. The first base metallization 115 is formed on the first base mesa 114 under the base terminal 221. The first base metallization 115 extends parallel to the first emitter strip 112 (out of the plane of FIG. 2), and connects to the base terminal 221 to receive electrical signals. The base feed 211 is formed of a stack comprising a bottom metal portion 211-1 and a top metal portion 211-2. The top metal portion 211-2 connects with the second metal layer 152 via contacts 211a and 211b. The bottom and top metal portions 211-1 and 211-2 may be part of the first metal layer 151 of the semiconductor structure 100. Alternatively, the base feed 211 may be formed of a single metal layer.

The semiconductor structure 100 likewise includes a collector bus 213, formed on the substrate 105 at a collector-side of the semiconductor structure 100. The collector bus 213 is connected to a collector terminal (not shown) shared among the transistors, e.g., the first transistor 110 and the second transistor 120. The first collector strips 113a and 113b of the first collector 113 (as well as the second collector strips 123a and 123b of the second collector 123) (not shown in FIG. 2) run parallel to the first emitter 112, and connect to the collector bus 213 to output electrical signals. The collector bus 213 is formed of a stack comprising a bottom metal portion 213-1 and a top metal portion 213-2. The top metal portion 213-2 connects with the second metal layer 152 via contacts 213a and 213b. Since the collector bus 213 connects with the collector strips of multiple transistors (e.g., first collector strips 113a, 113b and second collector strips 123a, 123b), the collector bus 213 extends perpendicular to the multiple collectors strips across the collector-side of the semiconductor structure 100, as can be seen more clearly in FIG. 3. The bottom and top metal portions 213-1 and 213-2 may be part of the first metal layer 151 of the semiconductor structure 100. Alternatively, the collector bus 213 may be formed of a single metal layer.

FIG. 2 further depicts illustrative additional buttresses of the semiconductor structure 100 positioned between the second metal layer 152 and the substrate 105, like the strip buttresses 161, 162 and 163, to provide additional physical support and to further reduce strain on the semiconductor junctions, e.g., caused by at least one of tensile and compressive stress. In the depicted embodiment, the semiconductor structure 100 includes representative base-side buttress 264 and representative collector-side buttress 265 formed between the second metal layer 152 and the substrate 105 adjacent to the first transistor 110. More particularly, referring to FIG. 2, the base-side buttress 264 is positioned between the first transistor 110 and the base feed 211, and the collector-side buttress 265 is positioned between the first transistor 110 and the collector bus 213. The base-side buttress 264 and the collector-side buttress 265 effectively create additional vertical stacks of metal from the metal pillar 154 to the substrate 105.

The base-side buttress 264 includes a bottom metal portion 264-1 and a top metal portion 264-2, and the collector-side buttress 265 includes a bottom metal portion 265-1 and a top metal portion 265-2. The base-side buttress 264 and the collector-side buttress 265 contact the second metal layer 152 via contact pads 268 and 269, respectively. Each of the base-side buttress 264 and the collector-side buttress 265 further reduces strain on the semiconductor junctions when the tensile stress and/or compressive stress are exerted on the metal pillar 154 with respect to the substrate 105. That is, the base-side buttress 264 and the collector-side buttress 265 provide corresponding alternative stress paths that substantially bypass the first and second transistors 110 and 120. The bottom metal portions (264-1 and 265-1) and the top metal portions (264-2 and 265-2) may be formed of metal, such as copper (Cu) or aluminum (Al), for example, although other materials capable of enhancing structural support and redirecting strain away from the first and second transistors 110 and 120 may be incorporated without departing from the scope of the present teachings. The bottom and top metal portions 264-1, 265-1, 264-2 and 265-2 may be part of the first metal layer 151 of the semiconductor structure 100. Alternatively, each of the base-side buttress 264 and the collector-side buttress 265 may be formed of a single metal layer. Generally, the presence of the various buttresses likewise reduce strain-induced changes to semiconductor bandgaps of the first and second transistors 110 and 120.

Figure 3:
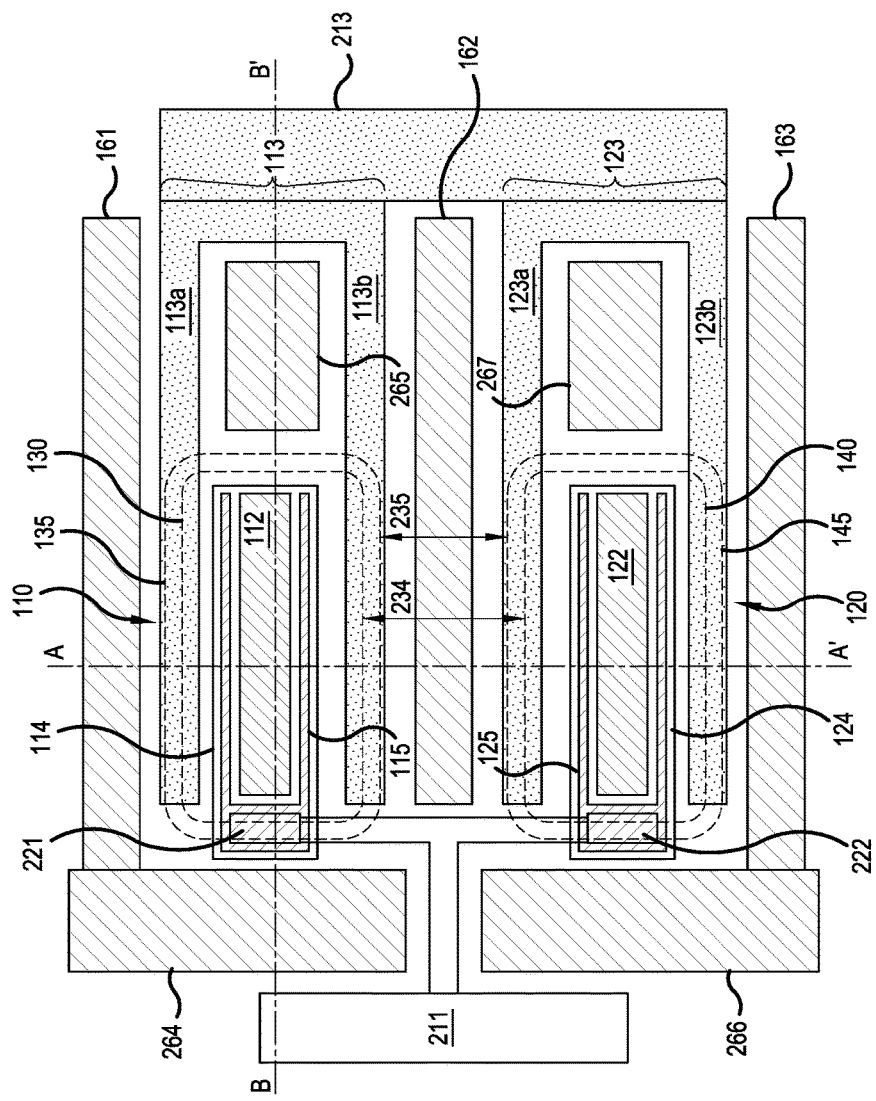
FIG. 3 is a simplified top view of the semiconductor structure shown in FIGS. 1 and 2 with a dielectric cushion and buttresses, in accordance with a representative embodiment.

FIG. 3 is a simplified top view of the semiconductor structure 100 shown in FIGS. 1 and 2 with dielectric cushions and buttresses, in accordance with a representative embodiment.

Referring to FIG. 3, the top view is taken from below the second metal layer 152, such that the tops of the various components are exposed, including strip buttresses 161, 162 and 163, base-side buttresses 264 and 266, and collector-side buttresses 265 and 267. The strip buttresses 161, 162 and 163 are positioned on either side of (and between) the first and second transistors 110 and 120. The base-side buttresses 264 and 266 are positioned between the first and second transistors 110 and 120 and the base feed 211. The collector-side buttress 265 is positioned between the first collector strips 113a and 113b, and between the collector bus 213 and the first transistor 110. The collector-side buttress 267 is positioned between the second collector strips 123a and 123b, and between the collector bus 213 and the second transistor 120. Although all three sets of buttresses are shown in FIG. 3 (strip buttresses 161, 162 and 163, base-side buttresses 264 and 266, and collector-side buttresses 265 and 267), it is understood that different combinations of the three types of buttresses may be provided in various configurations without departing from the scope of the present teachings, including only a single set of buttresses, for example.

Also shown in FIG. 3 are the first dielectric cushion 130 surrounded by the first passivation covering 135, and the second dielectric cushion 140 surrounded by the second passivation covering 145, which are indicated by dashed lines since they are situated in a plane above the second metal layer 152. As shown, the first dielectric cushion 130 and the first passivation covering 135 are positioned (on the second metal layer 152) over at least the first emitter 112 of the first transistor 110. Likewise, the second dielectric cushion 140 and the second passivation covering 145 are positioned (on the second metal layer 152) over at least the second emitter 122 of the second transistor 120. As stated above, this positioning reduces strain on the semiconductor junctions of the first and second transistors 110 and 120 (e.g., the emitter-base junctions) when tensile stress and/or compressive stress are exerted on the metal pillar 154 (not shown in FIG. 3) with respect to the substrate 105 (not shown in FIG. 3).

More particularly, the active emitter-base junctions are directly below the first and second emitters 112 and 122, respectively. Having the first and second dielectric cushions 130 and 140 over the extrinsic bases (outside the first and second emitters 112 and 122), over the first and second base metallization 115 and 125 or the first and second semiconductor sub-collector layers 101 and 102, or over the first collector strips 113a, 113b and the second collector strips 123a, 123b is beneficial, but less significant than having the first and second dielectric cushions 130 and 140 over the first and second emitters 112 and 122. For example, the distance from the pad openings (e.g., pad opening 234) to the first and second emitters 112 and 122 is the value varied to trade thermal and electrical conductivity against mechanical compliance. As discussed above, the pad opening 234 is defined by the distance of the first and second dielectric cushions 130 and 140, through which the second and third metal layers 152 and 153 connect. Also, passcut connection 235 is the distance between the first and second passivation coverings 135 and 145.

Although FIGS. 1-3 have been described with reference to first and second transistors, it is understood that the dielectric cushions and/or the various buttresses may be included in a corresponding semiconductor structure having more or fewer than two transistors, or having active semiconductor devices other than transistors, without departing from the scope of the present teachings. Also, as should be appreciated, the selections of the active semiconductor devices and the materials for the substrate, the dielectric layer, the dielectric cushions, the various metals and the like, dictate the processing techniques selected for fabricating the active semiconductor device and other components of the semiconductor structure. Such techniques and materials are within the purview of one of ordinary skill in the art of semiconductor processing and are generally not detailed herein to avoid obscuring the description of the representative embodiments. Illustratively, active semiconductor devices may include pseudomorphic high electron mobility transistors (pHEMTs), or enhanced pseudomorphic high electron mobility transistor (E-pHEMTs). Alternatively, the substrate may include silicon and the active devices may include metal oxide semiconductor (MOS) devices, such as a MOS field effect transistor (MOSFET), or complementary MOS (CMOS) device. Additionally, a combination of different active devices may be provided over the substrate to provide a desired circuit.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A semiconductor module comprising:
   a substrate;
   a transistor on the substrate;
   a dielectric layer disposed over the transistor and the substrate;
   a metal layer disposed over a top surface of the dielectric layer and the transistor, the metal layer contacting a portion of the transistor;
   a metal pillar disposed over the metal layer; and
   a dielectric cushion disposed entirely on the metal layer between the metal layer and the metal pillar over the transistor, the dielectric cushion comprising dielectric material that is softer than the metal pillar, for reducing strain on semiconductor junctions of the transistor when at least one of tensile or compressive stress is exerted on the metal pillar with respect to the substrate.

2. The semiconductor module of claim 1, further comprising:
   at least one buttress formed between the metal layer and the substrate, adjacent to the transistor, the at least one buttress further reducing strain on the semiconductor junctions when the at least one of tensile or compressive stress is exerted on the metal pillar with respect to the substrate, providing at least one corresponding alternative strain path that substantially bypasses the transistor.

3. The semiconductor module of claim 2, wherein the at least one buttress is formed of metal.

4. The semiconductor module of claim 3, wherein the at least one buttress is arranged parallel to an emitter strip of the transistor.

5. The semiconductor module of claim 1, wherein the dielectric cushion comprises a dielectric material.

6. The semiconductor module of claim 5, further comprising:
   a passivation covering surrounding at least a portion of the dielectric material of the dielectric cushion.

7. The semiconductor module of claim 6, wherein the dielectric material of the dielectric cushion comprises one of benzocyclobutene (BCB), polybenzoxazole (PBO) material, polyimide material or other organic spin-on thin film, and the passivation covering comprises a silicon nitride material, a silicon dioxide material or other inorganic material.

8. The semiconductor module of claim 1, further comprising a redistribution layer (RDL) between the metal layer and the metal pillar, the dielectric cushion being disposed between the metal layer and the RDL.

9. A module to be mounted on a printed circuit board (PCB), the module comprising:
   a plurality of transistors on a substrate, each transistor comprising:
   a sub-collector layer on or at least partially in the substrate;
   a base including base metallization and a base mesa stacked on the sub-collector layer and connected to a base feed;
   at least one emitter strip formed on the base mesa and electrically insulated from the base metallization; and
   at least one collector strip formed on the sub-collector layer adjacent the base mesa and connected to a collector bus, the at least one collector strip including at least a portion of a first metal layer;
   a first dielectric material disposed over the plurality of transistors;
   a second metal layer disposed over a top surface of the first dielectric material and electrically connected to the at least one emitter strip of each transistor;
   a plurality of dielectric cushions comprising a second dielectric material disposed on the second metal layer, each dielectric cushion being arranged over the base and the at least one emitter strip of each transistor, covering an entire top surface area of the at least one emitter strip of each transistor;
   a third metal layer disposed over the second metal layer and the plurality of dielectric cushions, the third metal layer contacting the second metal layer between the plurality of dielectric cushions; and
   a metal pillar disposed on the third metal layer,
   wherein the dielectric cushions are configured to protect semiconductor junctions of the plurality of transistors, respectively, against strain resulting from tensile and/or compressive stress exerted on the metal pillar with respect to the substrate.

10. The module of claim 9, further comprising:
    at least one buttress formed between the metal pillar and the substrate, and configured to further reduce strain on the semiconductor junctions by providing a corresponding alternative path to redirect the tensile and/or compressive stress exerted on the metal pillar with respect to the substrate away from the semiconductor junctions.

11. The module of claim 10, wherein the at least one buttress comprises a strip buttress arranged on the substrate between the plurality of transistors.

12. The module of claim 11, wherein the at least one buttress further comprises a base-side buttress arranged on the substrate adjacent a base feed connected to the base of each of the transistors.

13. The module of claim 11, wherein the at least one buttress further comprises a collector-side buttress arranged on the substrate between the plurality of transistors and the collector bus connected to the at least one collector strip of each of the transistors.

14. The module of claim 9, wherein each of the first dielectric material and the second dielectric material comprises one of a benzocyclobutene (BCB) material, a polybenzoxazole (PBO) material, or a polyimide material.

15. The module of claim 9, wherein the plurality of dielectric cushions reduce changes to a semiconductor bandgap occurring during assembly, and wherein the reduced changes to the semiconductor bandgap substantially stabilize quiescent current levels of each of the transistors.

16. The module of claim 9, wherein the third metal layer comprises a metal redistribution layer (RDL).

17. A module comprising:
- a substrate;
- a transistor on the substrate;
- a dielectric layer disposed over the transistor and the substrate;
- a metal layer disposed over a top surface of the dielectric layer and over the transistor, the metal layer contacting a portion of the transistor;
- a dielectric cushion disposed on the metal layer over the transistor;
- a metal pillar disposed on the metal layer and the dielectric cushion; and
- at least one buttress formed between the metal layer and the substrate, adjacent to the transistor, the at least one buttress reducing strain on semiconductor junctions when at least one of tensile or compressive stress is exerted on the metal pillar with respect to the substrate, providing at least one corresponding alternative stress path that substantially bypasses the transistor,
wherein the dielectric cushion comprises dielectric material that is softer than the metal pillar, for further reducing strain on the semiconductor junctions when the at least one of tensile or compressive stress is exerted on the metal pillar with respect to the substrate.

18. The module of claim 17, further comprising:
- a passivation covering surrounding at least a portion of the dielectric cushion.

19. The module of claim 17, wherein a distance between the dielectric cushion and an adjacent dielectric cushion over another transistor defines a pad opening through which the metal pillar electrically and thermally contacts the metal layer.

* * * * *